United States Patent [19]
Bran

[11] Patent Number: 5,539,995
[45] Date of Patent: Jul. 30, 1996

[54] CONTINUOUS FLOW VAPOR DRYER SYSTEM

[75] Inventor: Mario E. Bran, Garden Grove, Calif.

[73] Assignee: Verteq, Inc., Santa Ana, Calif.

[21] Appl. No.: 213,599

[22] Filed: Mar. 16, 1994

[51] Int. Cl.⁶ .................................... F26B 21/06
[52] U.S. Cl. .................... 34/77; 34/470; 34/76
[58] Field of Search .................. 34/470, 72, 76, 34/77, 78, 74; 210/774; 203/18

[56] References Cited

U.S. PATENT DOCUMENTS

| | | |
|---|---|---|
| 4,755,261 | 6/1988 | McCord ................................ 203/04 |
| 4,838,476 | 6/1989 | Rahn . |
| 4,841,645 | 6/1989 | Bettcher et al. . |
| 4,977,688 | 12/1990 | Roberson, Jr. et al. . |
| 5,054,210 | 10/1991 | Schumacher et al. . |
| 5,115,576 | 5/1992 | Roberson, Jr. et al. . |
| 5,371,950 | 12/1994 | Schumacher .............................. 34/78 |

FOREIGN PATENT DOCUMENTS

| | | | |
|---|---|---|---|
| 213538 | 1/1925 | Germany ................................ 34/3 |
| 3182818 | 7/1988 | Japan .................................... 34/78 |

*Primary Examiner*—Henry Bennett
*Assistant Examiner*—Dinnatia Doster
*Attorney, Agent, or Firm*—Knobbs, Martens, Olson & Bear

[57] ABSTRACT

An apparatus and method for rapidly drying an object, such as a semiconductor wafer, by creating a vapor flow from a liquid, such as isopropyl alcohol, and exposing the object to that flow. The apparatus comprises a heater for vaporizing liquid in a reservoir into a vapor, a condenser for subsequently condensing the vapor, and a treatment chamber into which the object to be dried is placed. The vaporization of the liquid at the reservoir and its subsequent condensation at the condenser creates a pressure gradient between the heater and the condenser, thereby forming a vapor stream. The object to be dried is exposed to this vapor stream, whereby some of the vapor condenses on the object and combines with the liquid on the object to produce a condensate which flows off the object, thereby drying the object. The method comprises the steps of heating a liquid to form a vapor, condensing the vapor to form a vapor stream, and positioning an object to be dried in the vapor stream.

13 Claims, 5 Drawing Sheets

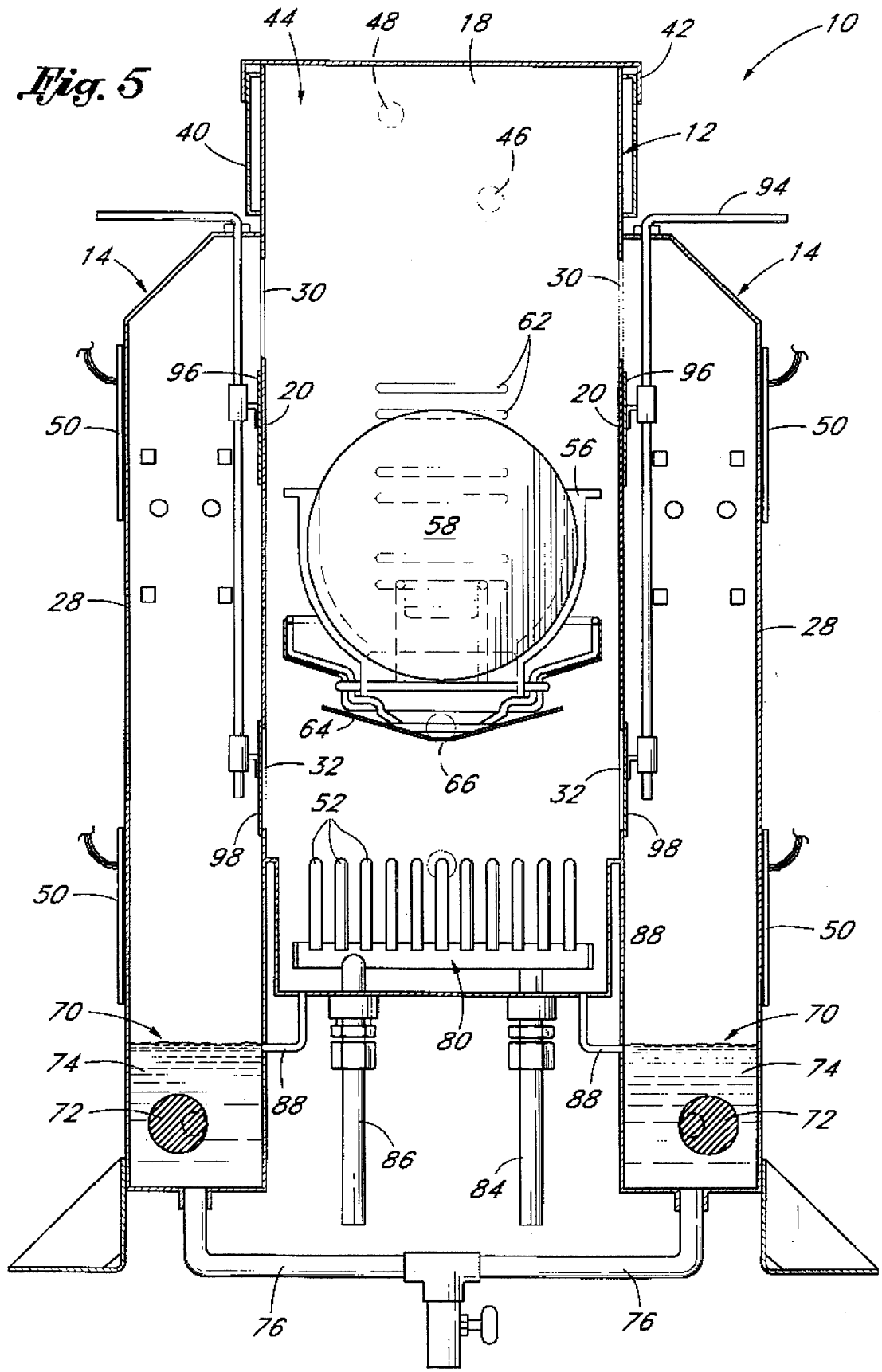

CONTINUOUS FLOW VAPOR DRYER SYSTEM

BACKGROUND OF THE INVENTION

1. Field of the Invention invention relates to an apparatus and method for exposing an object to a heated vapor, and more particularly, to a system for drying an object, such as a semiconductor wafer, by vaporizing a liquid, such as isopropyl alcohol, and exposing the object to the vapor.

2. Description of the Related Art

During fabrication, an electronic component, such as a semiconductor wafer, is normally subjected to many wet chemistry cleaning operations interspersed with rinsing steps. The rinsing is typically done with deionized (DI) water that, if allowed to dry naturally, can leave streaks, stains, or spots on the component's surface. As a result, various methods have been developed in an attempt to thoroughly dry a component's surface without leaving any contaminating residue.

One known drying method, disclosed by Bettcher et al. in U.S. Pat. No. 4,841,645, is to position a cassette full of wet semiconductor wafers into a heated dense vapor cloud of a high purity solvent, such as isopropyl alcohol (IPA). The IPA condenses on the wafers and combines with the water on the wafers' surfaces. As this liquefying process continues, the DI water loses its surfaces tension and shears off the wafers' surfaces. The cassette is then withdrawn above the heated vapor cloud and positioned in a cooling zone where the wafers dry completely. Vapor condensation formed within the chamber is removed from the chamber and processed through a purification and recovery system before it is reused.

A similar process, disclosed by Schumacher et al. in U.S. Pat. No. 5,054,210, consists of a vapor dryer system with distinct vapor and cooling zones. The semiconductor product is first lowered into the vapor zone where the replacement of the DI water with the IPA occurs. The semiconductor product is then raised to the cooling zone where the drying process is completed. The patent states that cooling in the cooling zone is desirable to return the IPA vapor to a liquid state so that it may free fall to the liquid sump to be reheated.

A somewhat different vapor drying system is disclosed by Roberson, Jr. et al. in U.S. Pat. No. 4,977,688 and U.S. Pat. No. 5,115,688. While that system does not have distinct vapor and cooling zones, it requires the drying operation to take place in a vacuum process chamber. A vacuum pump and a series of valves are used to control the internal pressure in the vacuum process chamber and the amount of IPA vapor and nitrogen that are introduced into the chamber. A fixed volume of IPA vapor is introduced into the vacuum process chamber to perform the drying operation and is evacuated from the chamber and discharged after the drying process is complete.

Similarly, in U.S. Pat. No. 4,838,476, Rahn discloses an apparatus for treating a printed circuit board by subjecting it to an unsaturated vapor cloud within a subatmospheric treatment chamber. As with Roberson, Jr. et al., the apparatus includes a chamber whose pressure is controlled with a vacuum pump. When the circuit boards to be treated are introduced into the treatment chamber via a conveyor belt, the unsaturated treatment vapor that has been generated within the chamber condenses on the boards and releases its latent heat of evaporation.

A primary drawback with the above-described Bettcher et al. and Schumacher et al. devices is that they employ a relatively stagnant vapor cloud to perform the drying or treating operation. To prevent the cloud from rising, the area above the cloud is cooled by condenser coils, causing some vapor to condense on cool surfaces and some to condense and fall into the hot vapor cloud. That condensed vapor or liquid which falls into the cloud both cools the cloud and must be reheated to be revaporized. This process is counterproductive and a considerable amount of time is required for a sufficient quantity of IPA vapor to condense on the surfaces of a semiconductor wafer in order to completely displace all of the DI water and thereby effectively dry the wafer. Lengthy drying times slow the overall process time for component fabrication.

In addition, Bettcher et al. and Schumacher et al. both require a two-step drying process—first placing the semiconductor wafer in a vapor zone and then removing it to a cooling zone. This two-step approach both complicates the drying process and necessitates additional handling of the very fragile components. Moreover, while neither Roberson, Jr. et al. nor Rahn disclose two separate processing areas, they both require processing at pressures substantially below atmospheric pressure, thereby requiring vacuum pumps and complex valving systems.

Furthermore, while Bettcher et al. provides a complex system for recycling both the IPA condensate and the water/IPA mixture, Roberson, Jr. et al. provides no mechanism whatsoever for recycling the IPA condensate.

SUMMARY OF THE INVENTION

Accordingly, it is an object of the present invention to provide an apparatus and method for rapidly drying an object, such as a semiconductor wafer, by creating a vapor flow and exposing the object to that flow.

Another object of the present invention is to provide a one-step drying operation that is accomplished in a single processing area.

It is also an object of the present invention to provide a drying system that operates in a continuous cycle.

It is a further object of the present invention to provide a system that simply and effectively recycles the IPA condensate that does not condense on the wafers.

It is still a further object of the present invention to provide a system that operates at substantially atmospheric pressure and does not require the use of a vacuum pump for its operation.

The present invention achieves these and other objects by providing a continuous flow, controllable vapor system wherein a cassette of semiconductor wafers is positioned in the processing area of a treatment chamber. In a preferred arrangement, vertically-oriented vapor conduits are disposed on each side of a treatment chamber with a quantity of liquid IPA in a reservoir at the lower end of each conduit. Heaters in communication with the reservoirs vaporize the liquid IPA, causing it to rise upwardly in the vapor conduits. From there, the heated IPA vapor passes through an upper opening in each vapor conduit and flows into the treatment chamber, passing downwardly over the semiconductor wafers to perform the desired drying function. The water/IPA mixture drips into a drip tray and to a drain. The remaining IPA vapor in the treatment chamber continues to flow downwardly and condenses on the cooled coils of a condenser. The IPA condensate drains through condensate portals into the liquid IPA reservoirs at the lower end of each vapor conduit to be recycled.

The apparatus of a preferred arrangement also includes lower openings in each of the side walls between the treatment chamber and the vapor conduits. External control levers are provided to open and close gates to the lower openings. With the present invention, a supply of vapor is readily available in a continuous flow-type operation, and the flow is readily controllable by the gate levers. With each gate in full operating position, the flow is directed in the desired manner to completely dry the semiconductor wafers. When there are no wafers in the drying chamber, the gates may be closed and the flow is, in effect, short-circuited to pass directly to the condenser, where the IPA vapor condenses and drains directly back into the liquid IPA reservoirs. This latter position can be viewed as an engine idling position, the "vapor engine" ready to become operative by moving the gates to their operating positions.

The present invention achieves excellent drying results and obtains faster drying times than conventional systems. In conventional systems that employ a cloud of vapor in a chamber, when the cold wafers are placed in the vapor cloud, the vapor quickly cools and it is then necessary to generate a new cloud by vaporizing additional solvent, thus slowing the drying process. Moreover, to inhibit the cloud from rising, the upper area of the vapor chamber is cooled, causing vapor to liquify and fall into the cloud, thereby cooling the vapor cloud. With the present invention, a stagnant vapor cloud does not form in the treatment chamber. The process can be thought of as creating a continuous vapor flow that readily condenses on the wafer to provide the desired drying action. The system is also easy to control by controlling the heating in the reservoir and the cooling by the condenser.

BRIEF DESCRIPTION OF THE DRAWINGS

FIG. 5 is a front elevation cross-sectional view of another embodiment of the vapor processing apparatus in accordance with the present invention.

DETAILED DESCRIPTION OF THE PREFERRED EMBODIMENT

By way of example, the invention will be described in connection with the drying of semiconductor wafers. The invention, however, is not limited to such use. The apparatus can be used to expose numerous objects to a vapor, including, but not limited to, electrical components, optical components, and any other object that requires drying or other treatment, such as degreasing.

Components of the Invention

Figure 1:
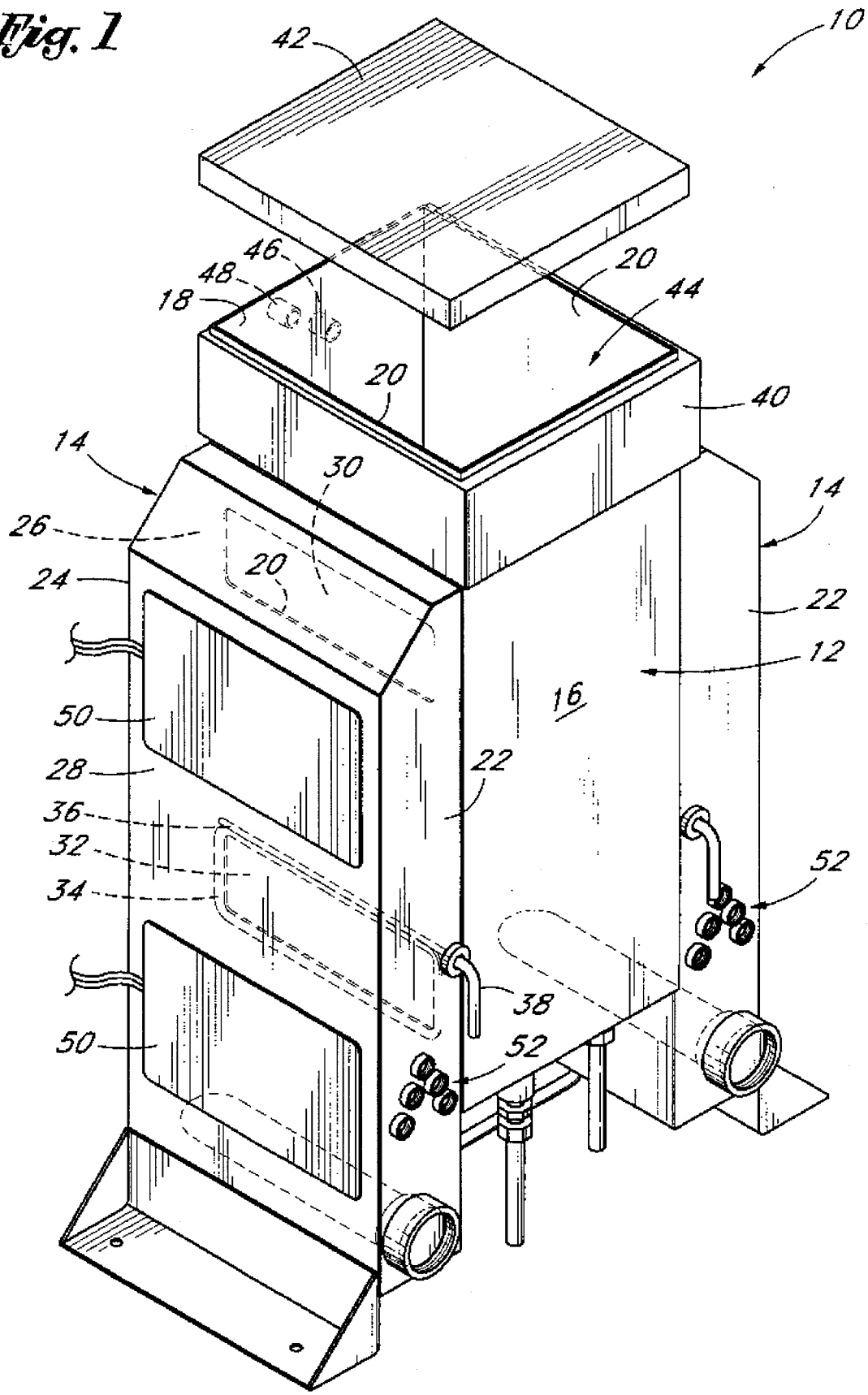
FIG. 1 is a perspective view of a preferred embodiment of the vapor processing apparatus in accordance with the present invention.

Referring to FIG. 1, the vapor processing apparatus 10 in a preferred embodiment comprises a 316 stainless steel box-shaped treatment chamber 12 with two vertically-oriented 316 stainless steel vapor conduits 14 positioned on two opposite sides of the treatment chamber 12. The treatment chamber 12 has a front wall 16, a rear wall 18, and two side walls 20. Similarly, each vapor conduit 14 has a front wall 22, a rear wall 24, an interior side wall 26 closest to the treatment chamber 12, and an exterior side wall 28 furthest from the treatment chamber 12. Each vapor conduit 14 is positioned such that it shares the upper portion of its interior side wall 26 with the upper portion of a side wall 20 of the treatment chamber 12. An upper opening 30 and a lower opening 32 in each side wall 20 of the treatment chamber 12 and in each interior side wall 26 of the vapor conduits 14 permit vapor to pass from the vapor conduits 14 and into the treatment chamber 12. A portion of the chamber walls 20 beneath the lower opening 32 is not common with the conduit wall 26, but instead is spaced from that wall so as to restrict direct heat transfer in that area.

A 316 stainless steel hinged gate 34 is positioned within each vapor conduit 14 adjacent to the lower opening 32 of each interior side wall 26. The gate 34 is mounted such that its hinge 36 is immediately above and parallel to the upper edge of the lower opening 32. A 316 stainless steel rod-like control lever 38 with a 90° bend at its forward end passes through the front wall 22 of each vapor conduit 14 and is attached to the gates 34. The forward end of each control lever 38 is external to the vapor conduits 14 and can be grasped and rotated, thereby rotating the gates 34.

A box-shaped auxiliary cooling jacket 40 made of 316 stainless steel is mounted on top of the treatment chamber 12 and a rectangular 316 stainless steel removable chamber cover 42 is positionable on top the auxiliary cooling jacket 40. With the cover removed, the interior of the treatment chamber 12 is exposed through chamber opening 44. Cool water enters the auxiliary cooling jacket 40 through the cooling jacket inlet 46, circulates through the auxiliary cooling jacket 40, and then exits through the cooling jacket outlet 48.

Electrically-powered silicone patch wall heaters 50 are glued onto the external surfaces of each of the exterior walls 28 of the vapor conduits 14. If desired, all of the exterior walls can be covered with suitable heaters to minimize condensation on the walls. These exterior wall heaters 50 and the mounting glue can be acquired from WATLOW. In addition, a variety of thermocouples, sensors, and measuring devices 52 are mounted on and through the external surfaces of the front walls 22 of the vapor conduits 14.

Figure 2:
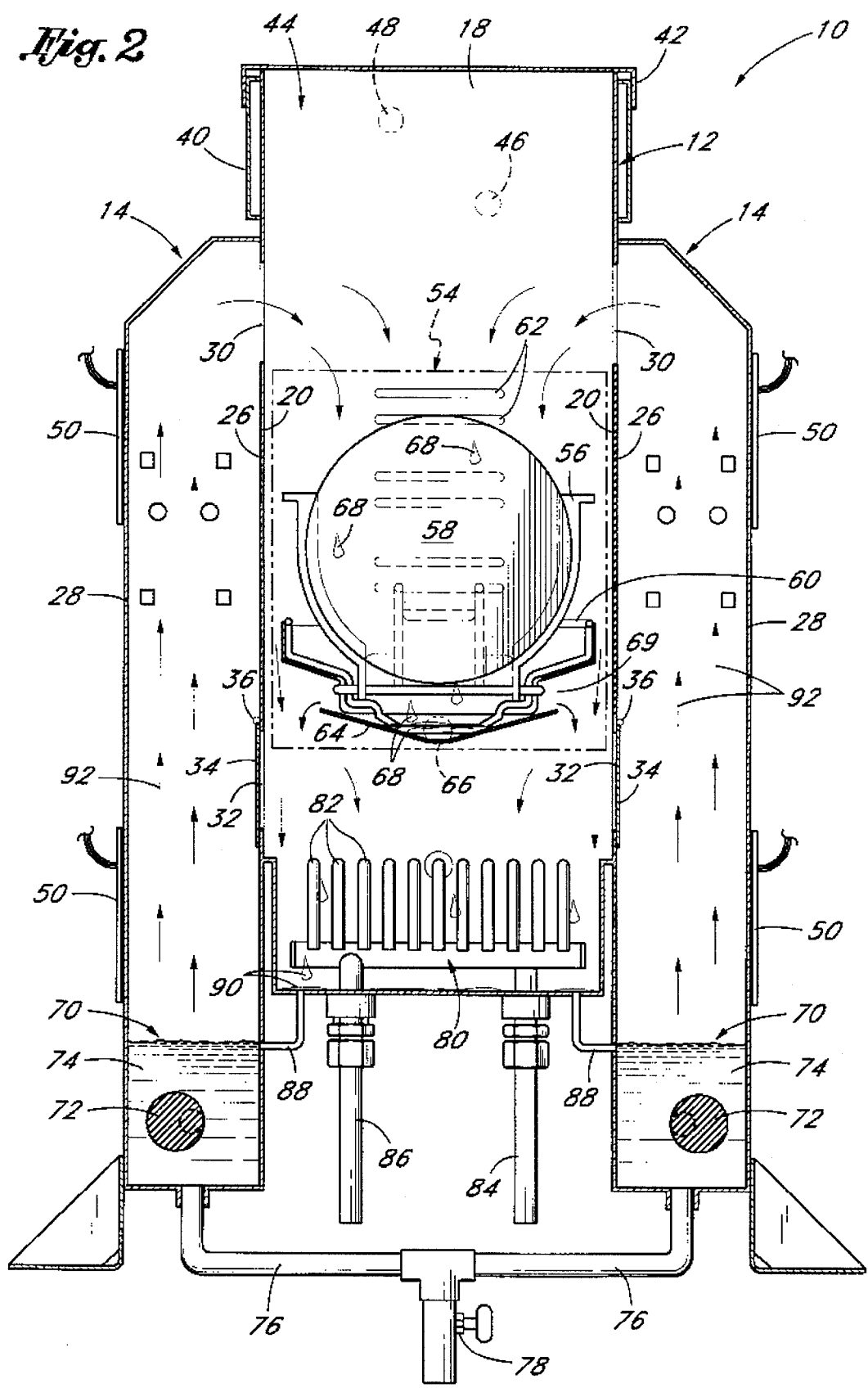
FIG. 2 is a front elevation cross-sectional view of the vapor processing apparatus depicted in FIG. 1 with control gates in their operating position.

Referring to FIG. 2, a processing area 54 is located in approximately the center of the interior of the treatment chamber 12, preferably below the upper openings 30 in the side walls 20 and above the lower openings 32 in the side walls 20. A wafer carrier 56, loaded with twenty-five semiconductor wafers 58, is placed on a support 60 within the processing area 54. The support is in turn positioned within the processing area 54 on rungs 62. The operator of the vapor processing apparatus 10 can select the appropriate rung 62 on which to position the support 60, thereby allowing the operator to vary the vertical position of the semiconductor wafers 58 within the processing area 54. In an alternate arrangement (not shown) the cassette may be supported from a suitable structure extending downwardly through the open upper end of the chamber 12.

Further, a drip tray 64 with a drain 66 is located beneath the wafer carrier 56 to collect all of the water/IPA mixture 68 that runs off the semiconductor wafers 58 during the drying process. Openings 69 in the sides of the tray permit the vapor to flow past the wafer flat surfaces and then through the side openings.

A reservoir of liquid anhydrous IPA 70 lies at the base of each of the vapor conduits 14, and an immersion heater 72 is located within each liquid IPA reservoir 70. In a prototype system for a cassette of 25 wafers, each liquid IPA reservoir 70 contains approximately 1 gallon of liquid IPA 74. The liquid IPA 74 should be of high purity in order to effectively dry the semiconductor wafers 58. While liquid IPA is the preferred material to employ for drying semiconductor wafers because of its ability to combine with water, its ready availability, and its low cost, other materials can also be used, such as ethanol and other solvents/alcohols.

Liquid IPA 74 can be added to or removed from the liquid IPA reservoirs 70 through the inlet/outlet pipes 76, which are interconnected to ensure that both of the liquid IPA reservoirs 70 are maintained at the same level. The inflow or outflow of the liquid IPA 74 into or out of the liquid IPA reservoirs 70 is controlled by an IPA control valve 78. In another arrangement, a separate, automatic IPA supply system may be provided based on the level of IPA saved in the reservoir.

An IPA condenser 80, consisting of a plurality of condensing tubes or coils 82, is located near the bottom of the interior of the treatment chamber 12, below the support 60. A cooled water inlet 84 and a cooled water outlet 86 circulate cool water through the IPA condenser 80 to maintain its cold temperature. Condensate passages 88 connect the bottom wall 20 of the treatment chamber 12 to the reservoirs 70 to pass IPA condensate 90 from the treatment chamber 12 into the liquid IPA reservoirs 70 in the adjacent vapor conduits 14.

Operation of the Invention

Referring still to FIG. 2, in operation, the chamber cover 42 is removed from the top of the auxiliary cooling jacket 40, thereby exposing the interior of the treatment chamber 12. A wafer carrier 56 loaded with wet semiconductor wafers 58 is placed into the interior of the treatment chamber 12. The wafer carrier 56 is positioned within the processing area 54 and onto the support 60, which has been selectively positioned onto one of the several rungs 62.

By circulating cool water through the auxiliary cooling jacket 40 on top of the treatment chamber 12, the vapor processing apparatus 10 is designed to prevent IPA vapor 92 from escaping the treatment chamber 12 through chamber opening 44. The flow rate of the cooled water through the auxiliary cooling jacket 40 ranges from 0.25 gal/min to 1.5 gal/min, depending on the level of cooling desired. However, because the IPA 92 vapor is volatile, it is advisable to close the treatment chamber 12 during its operation to ensure no IPA vapor 92 escapes. Consequently, the chamber cover 42 is then closed and sealed, although acceptable operation is obtained even if the treatment chamber 12 is not completely sealed.

The immersion heaters 72 are used to heat the liquid IPA 74 in the liquid IPA reservoirs 70 and thereby increase the vaporization rate of the liquid IPA 74. In operation, the immersion heaters 72 supply heat to the liquid IPA 74 in a maximum rate of about 9600 watts. By adjusting the heat output of the immersion heaters 72, the temperature of the liquid IPA 74 can be controlled, thereby controlling its vaporization rate. Liquid IPA boils at 82.3° and vaporizes at a rate of about 500 ccs per minute in a prototype system.

The liquid IPA 72 vaporizes at the surfaces of the liquid IPA reservoirs 70, forming IPA vapor 92 that rises from the surfaces of the liquid IPA reservoirs 70. The heating of the IPA vapor 92 increases the pressure of the IPA vapor 92 in the area near the surfaces of the liquid IPA reservoirs 70.

When each control lever 38 is in its operational position as illustrated, the lower openings 32 in side walls 20 are closed off from the treatment chamber 12 by the gates 34. Consequently, the IPA vapor 92 flows upwardly through the vapor conduit 14, through the upper openings 30, and into the treatment chamber 12. The IPA vapor 92 then flows downwardly through the treatment chamber 12, past the semiconductor wafers 58 on the wafer carrier 56, and to the IPA condenser 80, where the IPA vapor 92 condenses to form IPA condensate 90. The flow rate of the cooled water through the IPA condenser 80 ranges from 0.5 gal/min to 5 gal/min, depending on the rate of condensing desired. The IPA condensate 90 is then recycled by flowing back into the IPA reservoir 70 through the condensate passages 88. If necessary, a suitable valve or a trap could be positioned in each passage to insure one-way flow. The condensing of the IPA vapor 92 decreases the pressure of the IPA vapor 92 near the condenser 80, thereby forming a pressure gradient between the area immediately above the liquid IPA reservoirs 70 and the area adjacent the IPA condenser 80. The flow of the IPA vapor 92 through the treatment chamber 12 as a result of this pressure gradient creates a flow that may be referred to as an "IPA vapor breeze."

When the IPA vapor 92 flows past the semiconductor wafers 58, it mixes with or is absorbed by the DI water on the surfaces of the semiconductor wafers 58. The mixing or absorption reduces the DI water surface tension, causing the water/IPA mixture 68 to shed off the surface of the semiconductor wafers 58 and into the drip tray 64. This water/IPA mixture 68 flows from the drip tray 64 through drain 66 and is ultimately discharged and reprocessed. Because of the IPA flow, the wafers are quickly dried, in contrast to the stagnant cloud IPA dryer.

Figure 3:
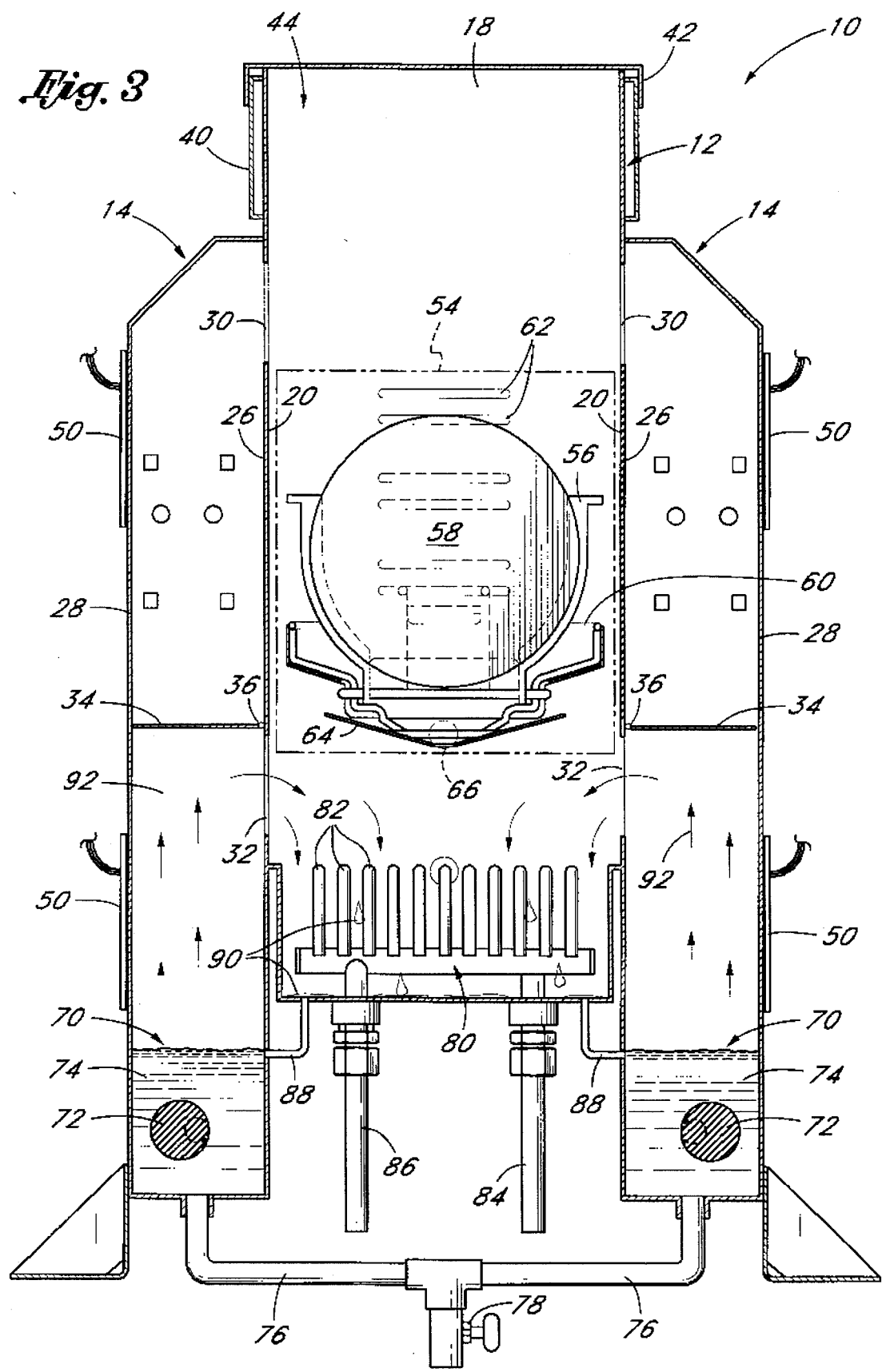
FIG. 3 is a front elevation cross-sectional view of the vapor processing apparatus depicted in FIG. 1 with control gates in their idling position.
Figure 4:
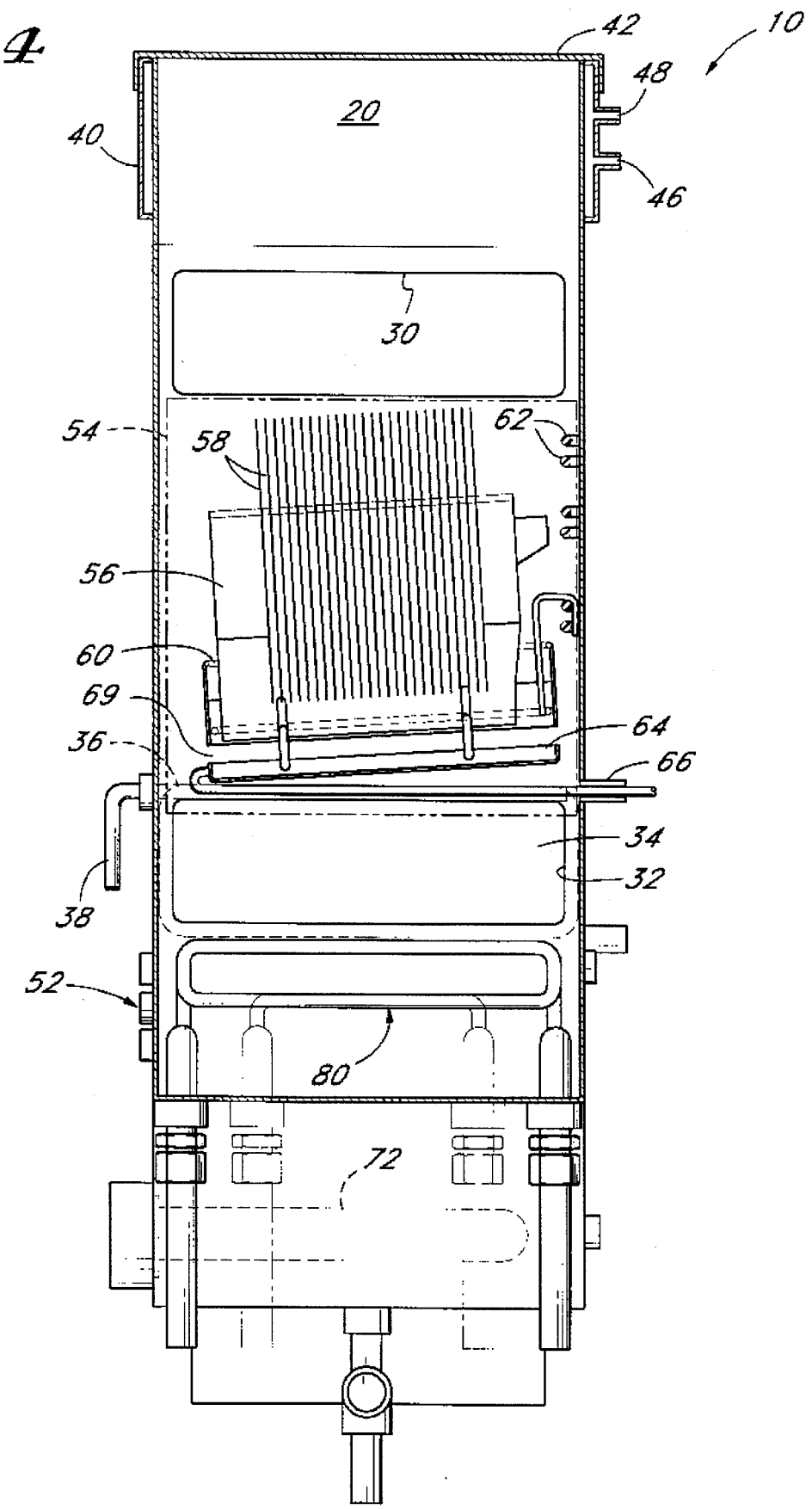
FIG. 4 is a side elevation cross-sectional view of the vapor processing apparatus depicted in FIG. 1.

Referring now to FIGS. 3–4, in each control lever's 38 idle position as illustrated, each control lever 38 has been rotated 90° about its hinge 36 such that the gates 34 now close off the upper portion of the vapor conduits 14 above the lower openings 32 in side walls 20. As a result, the IPA vapor 92 is precluded by the gates 34 from passing through the upper openings 30 in the side walls 20 and is instead rerouted to pass through the lower openings 32 in the side walls 20. The IPA vapor 92 therefore bypasses the processing area 54 and flows directly to the IPA condenser 80, where it condenses to form IPA condensate 90. This IPA condensate 90 is then recycled by flowing back into the liquid IPA reservoir 70 through the condensate passages 88.

When the semiconductor wafers 58 are dry, the control levers 38 may be moved to their idle position, the chamber cover 42 is opened, and the wafer carrier 56 is removed. The treatment chamber 12 is then ready to dry the next batch of wet semiconductor wafers 58. During the process of changing wafer carriers, neither of the immersion heaters 72 need to be turned off nor does the liquid IPA 74 need to cool; by routing the IPA vapor 92 directly to the IPA condenser 80, escape of the IPA vapor 92 from the treatment chamber 12 is minimized and the IPA vapor 92 will be continuously recycled between the IPA condenser 80 and the liquid IPA reservoir 70.

The exterior wall heaters 50 raise the temperature of the exterior walls 28 of the vapor conduits 14, thereby minimizing the condensation of the IPA vapor 92 on the interior of those exterior walls 28. In operation of a prototype system, the exterior wall heaters 50 supply heat to the exterior walls 28 of the vapor conduits 14 in an amount of about 7 watts per squire inch. In addition, the thermocouples, meters, sensors, and measuring devices 52 are used to control and monitor a variety of process parameters, including the temperature of the IPA vapor 92.

Referring now to FIG. 5, in another embodiment of the vapor processing apparatus 10, each control lever 94 is movable vertically and is rigidly attached to two both an upper gate 96 and a lower gate 98. In each control lever's 94 operational position as illustrated, the lower openings 32 in the side walls 20 are closed off from the treatment chamber 12 by the lower gates 98. Because the upper openings 30 in the side walls 20 are not obstructed by the upper gates 96, IPA vapor can flow upwardly through the vapor conduit through the upper openings 30 in the side walls 20, and into the treatment chamber 12.

In the control levers' 94 idle position, each control lever 94 is translated vertically upward such that the upper gates 96 now close off the upper openings 30 in the side walls 20 and the lower gates 98 do not obstruct the lower openings 32 in the side walls 20. As a result, IPA vapor is precluded by the upper gates 96 from passing through the upper openings 30 in the side walls 20 and is instead rerouted to pass through the lower openings 32 in the side walls 20.

In actual operation of prototype preferred embodiment of the present vapor processing apparatus, the drying time for a cassette of twenty-five semiconductor wafers was only about 4 minutes. This is believed to be faster than conventional vapor dryers of comparable size using relatively stagnant vapor clouds. Moreover, because the present invention operates as a continuous flow and does not require the generation of a vapor cloud, a cassette of wet wafers can be inserted immediately upon removal of the previous cassette of dry wafers. The vapor velocity can be conveniently increased by increasing the rate of condensing of vapor on the condenser and by increasing the rate of boiling of the IPA. Finally, because of the efficient recycling of the IPA condensate by the vapor processing apparatus described herein, very little IPA is lost, and the purity of the liquid IPA remains at acceptable levels. Consequently, the shortened drying cycle time and the efficient recycling of the IPA condensate of the present invention represent a significant advance in the state of the vapor processing art, and the wafer drying art.

The foregoing description should be taken as illustrative and not as limiting. Additional advantages and modifications will be readily apparent to those skilled in the art. The invention in its broader aspects is, therefore, not limited to the specific details, preferred embodiment, or illustrative examples shown and described. Accordingly, departures may be made from such details without departing from the spirit or scope of the general inventive concept as defined by the appended claims and their equivalents.

I claim:

1. An apparatus comprising:
    a) a liquid reservoir;
    b) a heater for heating the liquid to form a heated vapor, the heating of said vapor creating an increase in the pressure of said vapor proximate to said reservoir;
    c) a condenser for condensing said vapor to form a condensate, the condensing of said vapor creating a decrease in pressure of said vapor proximate to said condenser such that a pressure gradient is created between said reservoir and said condenser, causing a vapor stream to flow from said reservoir to said condenser;
    d) a processing area downstream from said reservoir and upstream from said condenser for positioning an object to be exposed to said vapor stream, said condenser being positioned such that condensate formed in said processing area or at said condenser does not fall into the heated vapor approaching said processing area; and
    e) including a passage for directing said vapor from said reservoir to a location above said processing area so that said vapor can flow downwardly through said processing area to said condenser, and wherein said reservoir is positioned laterally from said processing area and said condenser is positioned beneath said processing area.

2. The apparatus of claim 1, including a support for positioning said object within said processing area.

3. The apparatus of claim 2, including a drain tray adjacent to said support to direct condensate dripping from said object to a drain, said drain tray containing openings to permit the flow of said vapor through said openings.

4. The apparatus of claim 1, including a gate for directing said heated vapor directly onto said condenser and bypassing said processing area.

5. The apparatus of claim 1, including a drain for draining into said reservoir condensate which has condensed on said condenser.

6. The apparatus of claim 1, including a pair of said reservoirs disposed on opposite sides of said processing area, said condenser being positioned in the lower portion of said chamber, and both of said reservoirs being connected to the area adjacent to said condenser and lower than said condenser so that condensate flows to said reservoirs.

7. An apparatus comprising:
    a) a provider of a heated vapor which will readily condense and combine with water when exposed to a wet object;
    b) a processing area for positioning a wet object to be dried by said vapor;
    c) a conduit for ducting said vapor generally downwardly through said processing area and causing some of said vapor to condense on said object; and
    d) a condenser downstream from said processing area for condensing vapor and causing said vapor from said provider to flow past said processing area.

8. The apparatus of claim 7, wherein said provider includes a reservoir of liquid to form said vapor; and including a drain for ducting condensate formed by said condenser back to said reservoir to create a continuous vaporization and condensation cycle.

9. An apparatus for drying semiconductor wafers and the like comprising:
    a) a liquid reservoir;
    b) a heater for heating liquid in said reservoir to form heated vapor;
    c) a chamber having a support for positioning wet wafers to be dried by said vapor;
    d) a conduit for ducting said vapor to an area open to and above said support to permit said vapor to flow downwardly through said area and to cause some of said vapor to condense on said wafers;
    e) a condenser positioned beneath said support to condense vapor causing it to flow past said wafers;
    f) a drain line for draining to said reservoir condensed vapor which has condensed on said condenser;
    g) a valve for directing said vapor from said reservoir directly onto said condenser and bypassing said area in which said wafers are located; and
    h) a drain tray adjacent said support to direct condensate dripping from said wafers to a drain rather than dripping onto said condenser.

10. A method of drying an object comprising:

a) heating liquid in a reservoir to form a heated vapor, the heating of said vapor creating an increase in the pressure of said vapor proximate to said reservoir;

b) condensing said vapor with a condenser at a location spaced from said reservoir, the condensing of said vapor creating a decrease in pressure such that a pressure gradient is created between said reservoir and said condenser, causing a vapor stream to flow from said reservoir to said condenser;

c) positioning an object in a processing area and in said vapor flow downstream from said heater and upstream from said condenser, said condenser being positioned and said processing area being arranged such that condensate formed in said processing area or at said condenser does not fall into the vapor approaching said processing area; and d) including flowing said vapor stream into a space generally above said object and generally downwardly past said object causing some of said vapor to condense on said object and combine with a liquid on said object to produce a condensate which flows off said object to dry said object.

11. The method of claim 10, including draining said condensate from said condenser into said liquid reservoir.

12. The method of claim 10, including directing said vapor directly onto said condenser and bypassing said processing area rather than directing the vapor flow passed said object.

13. The method of claim 10, including positioning a reservoir on opposite sides of a central chamber containing said processing area, positioning said condenser beneath said processing area and above but laterally offset from said reservoirs; and directing said vapor flow upwardly from said reservoirs, laterally to said chamber, and downwardly through said processing area to said condenser.

* * * * *